(12) United States Patent
Moscaluk

(10) Patent No.: US 7,405,987 B1
(45) Date of Patent: Jul. 29, 2008

(54) LOW VOLTAGE, HIGH GAIN CURRENT/VOLTAGE SENSE AMPLIFIER WITH IMPROVED READ ACCESS TIME

(75) Inventor: Gary P. Moscaluk, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 327 days.

(21) Appl. No.: 11/340,103

(22) Filed: Jan. 26, 2006

Related U.S. Application Data

(60) Provisional application No. 60/650,425, filed on Feb. 4, 2005.

(51) Int. Cl.
*G11C 7/02* (2006.01)

(52) U.S. Cl. ............... 365/207; 365/205; 327/51

(58) Field of Classification Search .......... 365/207, 365/205; 327/51, 52
See application file for complete search history.

(56) References Cited

U.S. PATENT DOCUMENTS

| | | | |
|---|---|---|---|
| 5,789,948 A * | 8/1998 | Kim et al. .......... 327/55 |
| 6,239,624 B1 | 5/2001 | Yang et al. | |
| 6,353,568 B1 | 3/2002 | Sung | |
| 6,597,612 B2 | 7/2003 | Yamauchi | |
| 6,621,259 B2 | 9/2003 | Jones et al. | |
| 6,625,074 B2 | 9/2003 | Forbes | |
| 6,700,415 B2 | 3/2004 | Telecco | |
| 7,072,236 B2 * | 7/2006 | Matsuoka ............ 365/207 |
| 2002/0118576 A1 * | 8/2002 | Ohba et al. .......... 365/189.07 |

* cited by examiner

*Primary Examiner*—Richard T. Elms
*Assistant Examiner*—Toan Le
(74) *Attorney, Agent, or Firm*—Kevin L. Daffer; Daffer McDaniel, LLP

(57) ABSTRACT

A low voltage, high-gain current/voltage sense amplifier (ISA/VSA) circuit with improved read access time is provided herein. According to one embodiment, the ISA/VSA described herein includes a pair of current reference branches for generating a pair of reference currents in response to a pair of differential input signals supplied thereto. The differential input signals are differential voltages which are converted to differential currents by the current reference branches. In some cases, the current reference branches may be used for amplifying and mirroring the reference currents onto output nodes of the ISA/VSA. In doing so, the current reference branches may increase the amplification and improve the performance of the sense amp circuit, even under extreme mismatch conditions. In addition, positive feedback may be used within the ISA/VSA design to further increase the amplification and speed of the sense operation. The improvements described herein may, therefore, be used to obtain the fast read access times typically associated with high-speed memory devices.

20 Claims, 3 Drawing Sheets

US 7,405,987 B1

LOW VOLTAGE, HIGH GAIN CURRENT/VOLTAGE SENSE AMPLIFIER WITH IMPROVED READ ACCESS TIME

PRIORITY CLAIM

This application claims benefit of priority to provisional patent application No. 60/650,425 entitled "Low-Voltage High Gain Current/Voltage Sense Amplifier" filed Feb. 4, 2005.

BACKGROUND OF THE INVENTION

1. Field of the Invention

This invention relates to electronic circuits and, more particularly, to low voltage, high gain current/voltage sense amplifier circuits with improved read access time.

2. Description of the Related Art

The following descriptions and examples are given as background only.

Many modern semiconductor memories employ differential bit lines and some sort of differential amplifier or sensing circuit in their design. These differential amplifiers and sense circuits are commonly known as sense amplifiers (or "sense amps"). In addition to memory devices, sense amplifiers may be used in programmable arrays and many other applications. A wide variety of sense amps are known in the art, including current sensing and voltage sensing variations.

For example, dynamic random access memory (DRAM) devices often employ voltage sense amplifiers (VSAs) for detecting the state of a DRAM memory cell. In voltage sensing, the bitline is precharged before the memory cell is activated. When the memory cell is activated, the memory cell charges or discharges the bitline to maintain or change the voltage of the bitline. However, the bitline may be quite long in some memory devices (e.g., in large memory arrays), resulting in a large capacitive load for the memory cell. In some cases, the memory cell may not be able to provide enough cell current to quickly charge or discharge a large bitline, and an excessive amount of time (i.e., read access time) may be needed to read the memory cells. For this reason, voltage sensing may not be preferred in all memory devices.

Current sense amplifiers (ISAs) are also commonly used for detecting the state of a memory cell. For example, current sense amplifiers are well suited for measuring signals on heavily loaded capacitive lines, such as those found in large memory devices or programmable array devices, where it would be slow to measure voltage. Located in a sense amplifier circuit (SA), the current sense amplifier measures a current and turns this into a small differential voltage output. In some cases, the output of a current sense amplifier (ISA) may be passed to a voltage sense amplifier (VSA), which is also located in the sense amplifier circuit for amplifying the low voltage signal into a higher voltage signal. The output of the voltage sense amplifier may then be passed as the output of the sense amplifier circuit.

FIG. 1 illustrates one embodiment of a sense amplifier circuit that may be used for detecting a current (or voltage) differential between complementary bitlines of a memory array (such as memory array 100). In the embodiment shown, current sense amplifier (ISA) 130 is coupled for receiving a pair of differential currents ($I_{BL}$, $I_{BLB}$) from one or more complementary bitlines (BL, BLB) of memory array 100. In some cases, ISA 130 may be coupled for receiving the pair of differential currents from only one column of memory cells (e.g., column 0 via COLMUX 110). In other cases, ISA 130 may be coupled for receiving the pair of differential currents from more than one column of memory cells (e.g., columns 0-N via COLMUX 110 to 120). The column multiplexers (COLMUX) are generally used to switch between the pairs of bitlines, depending on the particular column of memory cells selected.

Although not illustrated herein, a voltage sense amplifier (VSA) may also be used for receiving a pair of differential voltages—instead of currents—from the complementary bitlines (BL, BLB) of memory array 100. As noted above, the choice between ISAs and VSAs may depend on several factors including, but not limited to, speed, memory array architecture and technology constraints (e.g., threshold voltages, saturation currents, etc.).

In many cases, ISA 130 may be implemented in three-stages, as shown in FIG. 1. For example, ISA 130 may include a sensing stage (140) for reading the memory cell data by sensing a current (or voltage) differential between a pair of complementary bitlines (BL, BLB), an amplifying stage (150) for amplifying the small differential output signal generated by the sensing stage, and an optional buffering stage (160). If included, the optional buffering stage may be used for supplying the sense amp output signal (SAOUT) with full rails (i.e., for outputting the sense amp signal with a voltage swing that extends between a power supply voltage and a ground supply voltage).

Unfortunately, many conventional sense amp designs fail to meet important design specifications as technological trends progress toward higher speeds, smaller geometries and lower power supply voltages. For example, conventional sense amp designs often fail to meet the fast read access times (e.g., about 4 ns to about 6 ns) specified for high-speed, low voltage (e.g., about 1 volt) memory devices, such as high density Asynchronous SRAM's (among others). In addition, many conventional sense amp designs fail to operate (i.e., fail to sense the correct data) under moderate to extreme mismatch conditions. These mismatch conditions (and therefore, the ability for conventional designs to operate) only worsen as circuit geometries continue to scale to smaller and smaller sizes.

Therefore, a need exists for an improved sense amp design with improved read access times and reduced sensitivities to device mismatch. Such an improved sense amp design would be particularly useful in high-speed, low voltage memory applications.

SUMMARY OF THE INVENTION

The following description of various embodiments of memory devices, sense amplifier circuits and methods is not to be construed in any way as limiting the subject matter of the appended claims.

According to one embodiment, a method is provided herein for operating a sense amplifier circuit. In some cases, the method may utilize a sensing stage of the sense amplifier circuit for: (i) generating a pair of differential reference currents in response to a pair of differential input signals supplied to input nodes of the sensing stage; (ii) amplifying the pair of differential reference currents; (iii) mirroring the amplified currents to generate a pair of differential voltages upon output nodes of the sensing stage; and (iv) amplifying the pair of differential voltages before the amplified voltages are supplied to a subsequent amplifying stage of the sense amplifier circuit. In performing steps (i)-(iii), the method may improve the accuracy and reliability of the sense amplifier circuit by reducing its sensitivity to device mismatch. In addition, step (iv) may provide the differential voltages with a relatively large gain, even when relatively small differential input signals are supplied to the input nodes.

According to another embodiment, a sense amplifier circuit is provided herein with at least a sensing stage and an amplifying stage. For example, the sensing stage may include a pair of input transistors, a pair of current mirror circuits, a pair of cross-coupled transistors and a pair of output nodes. The pair of input transistors may be coupled for generating a pair of differential reference currents in response to a pair of differential input signals supplied to input nodes of the sensing stage. The pair of current mirror circuits may be coupled for mirroring the pair of differential reference currents to generate a pair of differential voltages upon the output nodes of the sensing stage. The pair of cross-coupled transistors may be coupled for amplifying the pair of differential voltages supplied to the output nodes. In some cases, a pair of voltage clamping circuits may be used for clamping the pair of differential voltages once they reach predetermined voltage levels. In other words, the clamping circuits may be used to prevent the sensing stage from prematurely latching its output by preventing the differential voltages from reaching the rails (i.e., vpwr and vgnd).

The sensing stage described herein improves upon earlier designs by providing increased amplification, speed and accuracy. For example, amplification is increased by using strong n-channel devices for the pair of input transistors. As used herein, a "strong" device is one having a relatively larger gate width and relatively smaller gate length than a "weak" device. The strong n-channel devices may be used in the sensing stage for supplying an even greater amount of differential reference current to the current mirrors than could be supplied with weak n-channel devices.

Amplification may be further increased by the current mirror circuits and cross-coupled devices described above. For example, the current mirror circuits may each include a first transistor, which is diode-connected and shares a common gate connection with a second transistor. In a preferred embodiment, the current mirror circuits may be configured for amplifying the reference currents before they are mirrored to the output nodes. This may be accomplished by forming the first and second transistors, such that one is N times larger than the other. In one example, amplification may be increased by selecting any integer value of N, which is greater than or equal to 2.

Once the amplified reference currents are mirrored to the output nodes, the p-channel cross-coupled devices may be used to amplify the differential voltages supplied to the output nodes. In addition to increasing the gain (i.e., the amplification of the sensing stage), the positive feedback provided by the cross-coupled devices improves the speed of the sensing operation. Insensitivity to device mismatch (and therefore, increased accuracy) is provided by the strong n-channel devices used for the pair of input transistors. The large gain of these devices corresponds to a small standard deviation, and therefore, a small mismatch between the transistors of the input pair. In addition, since voltages are more susceptible to mismatch than currents, the generation of a differential reference current (by the input transistors) makes the sensing stage of the sense amplifier circuit more robust.

According to another embodiment, a memory device is provided herein. In some cases, the memory device may include a sense amplifier circuit coupled to a plurality of memory cells arranged in a plurality of rows and columns. In some cases, the sense amplifier circuit may include a sensing stage, an amplifying stage and an optional buffer stage. For example, the sensing stage may be configured for: (a) generating a pair of differential reference currents in response to a pair of differential input signals received from at least one of the plurality of memory cells, (b) amplifying the pair of differential currents, (c) mirroring the amplified currents to generate a pair of differential voltages, and (d) amplifying the pair of differential voltages before they are supplied to the amplifying stage. The pair of differential voltages may then be amplified further by the amplifying stage. If the buffer stage is included, the buffer stage may be used for outputting the amplified pair of differential voltages with a predetermined voltage swing.

In some cases, the memory device may include a synchronous memory device. For example, the sensing stage may include a pair of input transistors, a pair of current mirror circuits and a pair of cross-coupled transistors. The input transistors may be used for generating the pair of differential reference currents in response to the pair of differential input signals. The current mirror circuits may be used for amplifying the pair of differential reference currents and for mirroring the amplified currents to generate the pair of differential voltages upon a pair of output nodes associated with the sensing stage. The cross-coupled transistors may then be used for amplifying the pair of differential voltages supplied to the output nodes. Once the differential voltages are driven to the rails, the differential voltages may be latched to the amplifying stage in accordance with synchronous operation.

In other cases, the memory device may include an asynchronous memory device. For example, a pair of voltage clamping circuits may be included within the sensing stage for clamping the pair of differential voltages once they reach predetermined voltage levels. The voltage clamps prevent the sensing stage from latching by preventing the differential voltages from reaching the power supply and ground supply voltages. Such a feature may be desirable in asynchronous operation.

BRIEF DESCRIPTION OF THE DRAWINGS

Other objects and advantages of the invention will become apparent upon reading the following detailed description and upon reference to the accompanying drawings in which.

Figure 1:
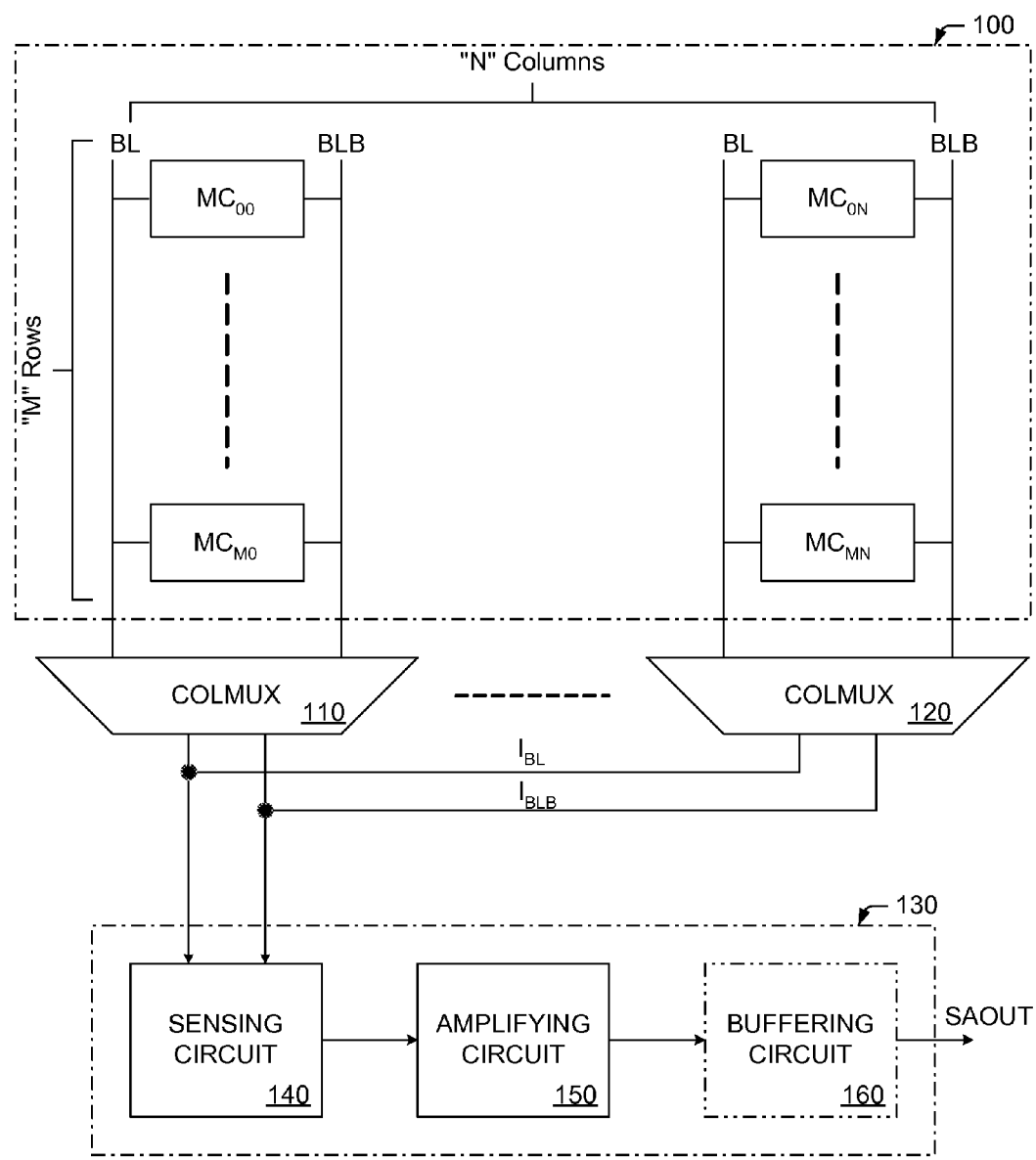
FIG. 1 is a block diagram illustrating a memory device including a sense amplifier circuit coupled to a plurality of memory cells.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Sense amplifiers may be used in any type of memory design or application where small differential voltages or currents need amplification. For example, sense amplifiers are widely used to measure differential signals between the complementary bitlines of a memory cell, and for conducting the sense operation with substantial amplification and subsequent speed improvement. One of the main goals in high-speed memory designs is to sense a bitline differential voltage (or memory cell read current) as fast as possible to obtain the fastest read access time.

Figure 2:
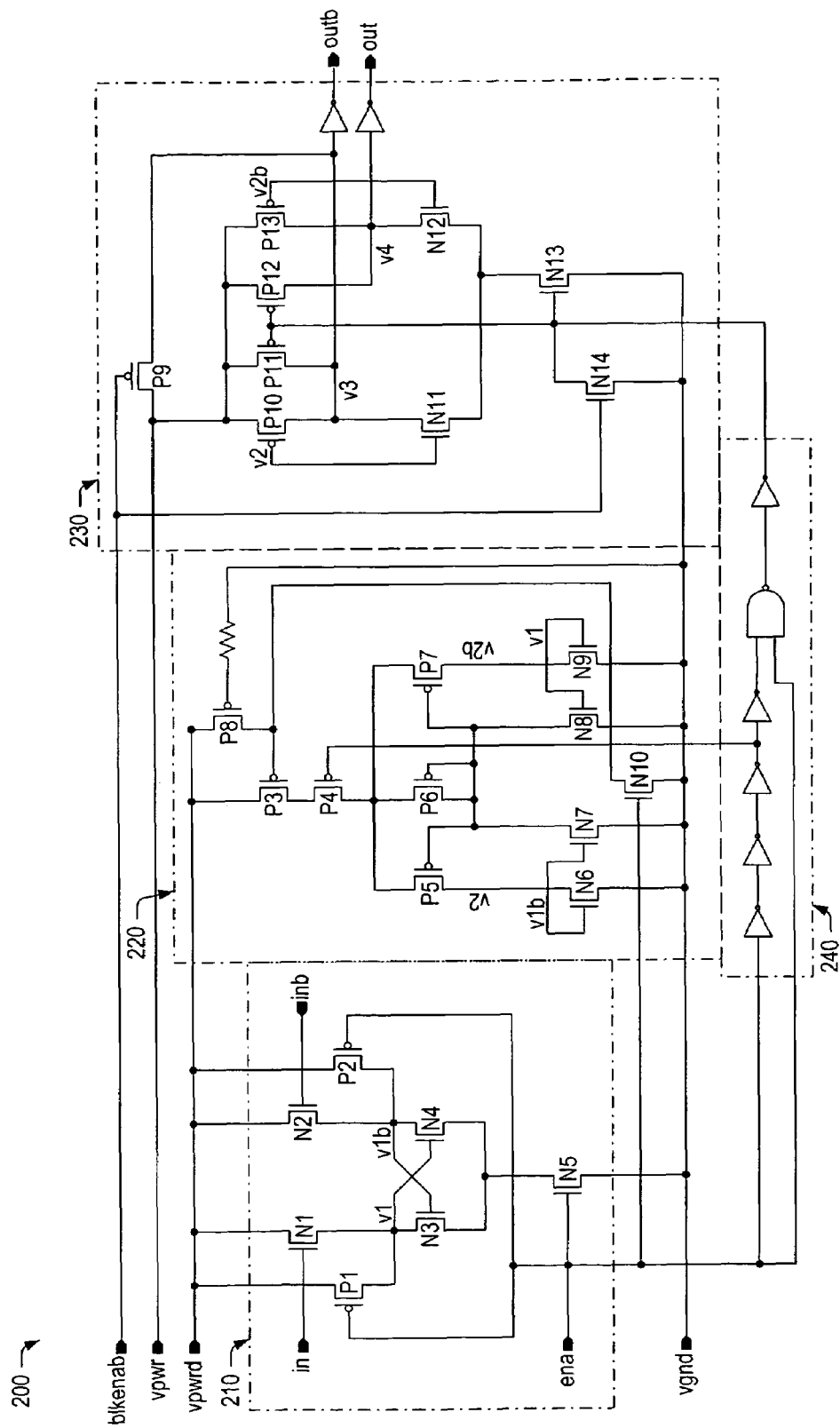
FIG. 2 is a circuit diagram illustrating one embodiment of a sense amplifier circuit.

FIG. 2 illustrates one embodiment of a sense amplifier circuit 200 with three stages of detection and amplification. In the first stage, a linear voltage sense amplifier (VSA) 210 reads the memory cell data by sensing the input voltage differential (in, inb) supplied to the input nodes of the first stage. As described in more detail below, VSA 210 may be configured for generating a small differential voltage (v1, v1b) in response to the pair of differential voltages (in, inb) received at the input nodes.

In most cases, the small differential voltage (v1, v1b) generated by VSA 210 will be supplied to a second stage differential amplifier 220, where the first stage signals (v1 and v1b) are amplified to generate second stage signals (v2 and v2b). For example, the first stage signals (v1, v1b) may be amplified to a threshold voltage somewhat below VPWR (for the high voltage signal) and a threshold voltage somewhat above VGND (for the low voltage signal). In some cases, second stage signals v2 and v2b may be supplied to an optional third stage buffer circuit 230. If included, buffer circuit 230 may be used to supply the sense amplifier output (out, outb) with full rail signals (i.e., to output the sense amp signal with a voltage swing that extends between VPWR and VGND). In addition to the elements described above, a delay circuit 240 may be used to control the timing of sense amp circuit 200. For example, delay circuit 240 may include a plurality of logic elements for providing progressively delayed versions of the enable signal (ena) to certain transistors within the first, second and third stages. The particular embodiment shown in FIG. 2 will now be described in more detail.

In the embodiment of FIG. 2, sense amplifier 210 uses a voltage sensing approach for generating a small differential voltage (v1, v1b) in response to the differential input voltages (in, inb) supplied thereto. In particular, VSA 210 uses weak n-channel input devices (N1, N2) for sensing the differential input voltages (in, inb). The differential input voltages (in and inb) are amplified based on the gate-to-source voltage (Vgs) of the n-channel input devices (N1, N2) to generate the first stage signals (v1, v1b). The first stage signals (v1, v1b) are further amplified by cross-coupled n-channel transistors (N3, N4).

In the embodiment of FIG. 2, differential amplifier 220 uses a dual-amplification approach for generating the second stage signals (v2, v2b). In this approach, two n-channel devices (N6/N7 or N8/N9) are used to determine the gate-to-source voltage (Vgs) and the drain-to-source voltage (Vds) of the p-channel supply devices (P3-P7). As shown in FIG. 2, for example, the first stage signals (v1, v1b) are supplied to the gate terminals of transistor pair N8/N9 and transistor pair N6/N7, respectively. Since v1 and v1b are amplified differential voltages, one of the transistor pairs (N6/N7 or N8/N9) will have a larger Vgs. For example, if v1b is higher in voltage than v1, the Vgs of N6/N7 will be higher than the Vgs of N8/N9. This forces the Vds of transistor N7 to ground. The opposite would be true (i.e., the Vds of transistor N8 would be forced to ground) if v1 were higher in voltage than v1b. Because the gate terminals of transistors P5 and P7 are tied to the same node, the amplification of the second stage depends on gate-to-source voltage differential between transistors N6 and N9. If the Vgs of transistor N6 is higher than the Vgs of transistor N9 (i.e., the Vds of N9 is higher than N6), the v2b signal will be higher in voltage than the v2 signal.

In some cases, the second stage signals may be supplied to a third stage, where a simple buffer circuit 230 is used to supply the output of the sense amplifier with full rail signals.

For example, the second stage signals (v2, v2b) may be supplied to a pair of complementary transistors (P10/N11, P13/N12), as shown in FIG. 2. Depending on the voltage level of the second stage signals, one of the signals (e.g., v2) will be pulled up towards VPWR, while the other (e.g., v2b) is pulled down towards VGND.

Although suitable in some applications, the sense amplifier circuit shown in FIG. 2 exhibits a relatively slow response to small differential input voltages (which reduces the read access time), and requires a relatively large differential input voltage to correctly sense under extreme device mismatch. As is known in the art, device mismatch may occur during fabrication of a semiconductor device, causing otherwise identical devices (e.g., two n-channel transistors with identical gate areas, dopant concentrations, etc.) to exhibit substantially different threshold voltages and drain currents. As described in more detail below, sense amp circuit 200 may fail to operate (i.e., may fail to sense the correct data) under extreme mismatch conditions unless large differential input voltages are provided.

More specifically, the amplification, speed and accuracy of the first stage design shown in FIG. 2 is limited by several factors. First, amplification is limited because the drain terminals of the n-channel input devices (N1, N2) are directly connected to the power supply voltage (VPWR). Connecting the input devices in such a manner causes the threshold voltage (Vth) associated with the input devices to be increased by the body effect, a phenomenon that occurs when the source-to-body voltage of the device is non-zero. In addition to producing a relatively smaller voltage swing in signals v1 and v1b, the increased threshold voltage decreases the effective sensing speed of the first stage, and thus, the read access time associated with the sense amp circuit.

Amplification is further limited by the use of weak input devices (i.e., transistors with short gate widths and long gate lengths) and same size transistors throughout the first stage. For example, weak input devices and n-channel transistors having the same size are used in the first stage design of FIG. 2 to reduce the effects of device mismatch. Unfortunately, the long gate lengths of the weak input devices provide very little amplification, due to the increased threshold voltage and lower saturation current associated with such devices. In addition, the first stage design shown in FIG. 2 may require a relatively large differential input voltage (in, inb) and/or higher supply voltage to correctly sense memory cell data under extreme mismatch conditions. Such a large differential voltage may not be available in all applications (e.g., some high-speed devices). Higher supply voltages may also be unavailable in low voltage applications.

In order to overcome the disadvantages described above, it would be desirable to provide a first stage design with improved amplification, speed and accuracy. An improved first stage design would provide a faster time response and would be capable of using a smaller differential input voltage than the first stage design described above. When incorporated within a sense amp circuit; the improved first stage design could be used to provide significantly faster read access times (e.g., up to 50% faster) with reduced sensitivity to device mismatch.

Figure 3:
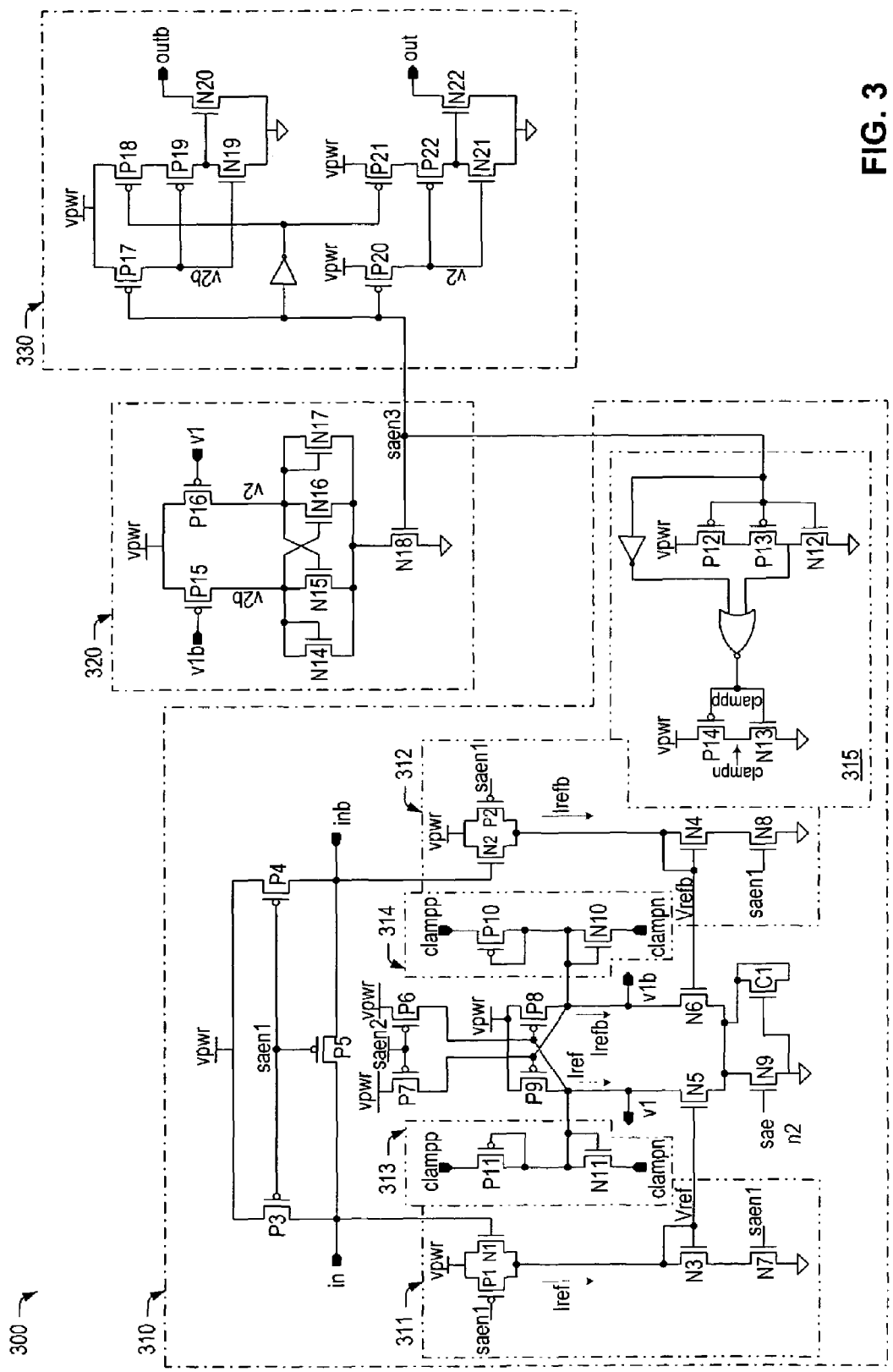
FIG. 3 is a circuit diagram illustrating one embodiment of an improved sense amplifier circuit.

An embodiment of an improved sense amplifier circuit 300 is shown in FIG. 3. As noted above, a primary objective of the improved sense amp design is to sense a differential bitline voltage or memory cell read current as fast as possible (i.e., to obtain the fastest read access time). A sense amp design with a "fast" read access time requires only a minimum amount of bitline differential voltage or memory cell read current to correctly sense memory cell data. The improvements described herein are, therefore, well suited for use within high-speed, low voltage sense amp designs (such as found within many DRAM's, SRAM's, and non-volatile memory like SONOS, FRAM, Flash, etc.).

Upon first glance, the improved sense amplifier circuit shown in FIG. 3 may appear to include a 3-stage design, similar to those described above and shown in FIGS. 1-2. For example, a first stage (i.e., sensing stage) 310 is included for receiving a differential input signal (in, inb) and for generating a first stage differential voltage signal (v1, v1b) in response thereto, while a second stage (i.e., amplifying stage) 320 is included for amplifying the differential voltage signal to generate a second stage differential voltage signal (v2, v2b). In some cases, an optional third stage (i.e., buffering stage) 330 may be included for supplying the sense amplifier outputs (out, outb) with a predetermined voltage swing.

However, the sense amplifier circuit shown in FIG. 3 offers many advantages over the circuit described above. First of all, the first stage design shown in FIG. 3 utilizes a current/voltage sense amplifier for detecting the state of a memory cell. In other words, the ISA/VSA shown in FIG. 3 is used for sensing a bitline differential current followed by a subsequent differential voltage. As described in more detail below, the first stage design shown in FIG. 3 improves upon previous designs by providing increased amplification and sensing speed, as well as reduced sensitivity to mismatch.

The implementation and operation of the improved sense amp design will now be described in accordance with one embodiment of the invention (shown in FIG. 3). However, it should be noted that although various aspects of the invention are described in the context of a particular embodiment, one skilled in the art would recognize how the invented circuits and methods could be modified to produce alternative embodiments without departing from the intended scope of the invention. The description provided below is intended to encompass all such modifications/alterations.

As shown in FIG. 3, ISA/VSA 310 uses a current and voltage sensing approach for generating a differential voltage (v1, v1b) in response to the differential input signals (in, inb) supplied thereto. Unlike previous embodiments, the differential input signals (in, inb) are supplied to a pair of current reference branches (311, 312) comprising strong n-channel input devices (N1, N2) and current mirror devices (N3/N5, N4/N6). As described in more detail below, the strong input devices are coupled for receiving the differential input signals (in, inb) and for generating a pair of differential current reference signals (Iref, Irefb) in response thereto. The current mirror devices are then coupled for amplifying and mirroring the differential reference currents to generate a pair of differential voltages (v1, v1b) upon the output nodes of the first stage.

To simplify the disclosure, ISA/VSA 310 may be described as including an input stage and an output stage. For example, the input stage of ISA/VSA 310 may include current reference branches 311, 312 and p-channel devices P3, P4 and P5. The output stage of ISA/VSA 310 may include p-channel devices P6-P9, n-channel devices N5, N6, N9 and capacitor C1. In some embodiments, the output stage may also include a pair of voltage clamping circuits 313, 314 with associated circuitry 315 for generating a pair of clamping signals (clampn, clampp). If included, voltage clamping circuits 313, 314 may be used to prevent latching of the first stage voltage signals (v1, v1b) once sensing has occurred.

The input stage of ISA/VSA 310 will now be described in more detail. As shown in FIG. 3, current reference branches 311, 312 may each include a strong n-channel input transistor (N1 or N2) for generating a reference current (Iref or Irefb) upon receiving a differential input signal (in or inb) at its gate terminal. The input transistors may be implemented with matched devices to maintain good performance over device mismatch. In addition, performance over mismatch is improved by utilizing strong—rather than weak—n-channel devices (i.e., transistors with large gate widths and short gate lengths) for the input transistors. More specifically, the strong n-channel devices exhibit good performance over device mismatch and provide a slight differential current with very little input voltage differential. The strong n-channel input devices also exhibit infinite input impedance, which further improves performance over device mismatch In addition, current references branches 311, 312 may each include a current mirror device (N3/N5 or N4/N6) for mirroring the reference current (Iref or Irefb) to the output stage of ISA/VSA 310. For example, the reference current generated at the source terminal of the input device (N1 or N2) may be supplied to a diode-connected transistor (N3 or N4) of the current mirror device. As described herein, a "diode-connected transistor" is a transistor with mutually-coupled drain and gate terminals. Upon receiving the reference current, the diode-connected transistor generates a reference voltage (Vref or Vrefb) corresponding to the reference current. Once generated, the reference voltage is supplied to the gate terminal of the remaining transistor (N5 or N6) within the current mirror device for generating an exact replica (or scaled version) of the reference current at its drain terminal. In order to maintain good performance over device mismatch, diode-connected transistors N3, N4 and transistors N5, N6 may be implemented with matched devices.

In some embodiments, the current mirror devices (N3/N5; N4/N6) may be configured for amplifying and mirroring the reference currents (Iref, Irefb) to the output stage of ISA/VSA 310. For example, the current mirror transistors may be formed such that one transistor is N times larger than the other transistor. In one example, transistors N5 and N6 are formed 2 times larger than diode-connected transistors N3 and N4 to provide an amplification ratio of 2:1. However, the amplification ratio is not limited to 2:1 and may be increased or decreased, as desired. For example, a substantially higher amplification ratio may be obtained by increasing the size of transistors N5/N6 and N3/N4. Since current consumption increases with transistor size, the trade-off between current consumption and gain/amplification must be carefully considered before selecting an appropriate amplification ratio.

In other embodiments, the current mirror devices (N3/N5, N4/N6) may be configured for mirroring the reference currents (Iref, Irefb) to the output stage of ISA/VSA 310 without amplification. In other words, transistors N5/N6 and N3/N4 may each be implemented with the same size device, so that an exact replica of the reference current is mirrored between the input and output stages of ISA/VSA 310. It is noted, however, that current mirror amplification may be preferred in most embodiments of the invention, so that ISA/VSA 310 may continue to correctly sense memory cell data, even when small differential input signals (in, inb) are supplied thereto (e.g., when using low supply voltages).

The output stage of ISA/VSA 310 will now be described in more detail. For example, the output stage includes a pair of cross-coupled p-channel transistors (P8, P9) for supplying positive feedback to the output nodes of ISA/VSA 310. The cross-coupled transistors are preferably implemented with matched devices. As shown in FIG. 3, the source terminals of cross-coupled transistors P8, P9 are connected to the power supply voltage (vpwr), while the gate/drain terminals of transistors P8, P9 are connected to the output nodes. When the output nodes are released by transistors P6 and P7, cross-coupled transistors P8 and P9 further increase amplification by increasing the voltage differential between v1 and v1b of ISA/VSA 310. The positive feedback provided by the cross-coupled transistors may, therefore, be used to obtain relatively large gain and fast amplification when small differential input signals are supplied to the input stage.

In some embodiments, a pair of voltage clamping circuits (313, 314) may be included within the output stage to prevent ISA/VSA 310 from latching once sensing has occurred. In other words, because of the large gain provided by cross-coupled transistors P8 and P9, voltage clamps (313, 314) may be used to insure that the differential voltages (v1, v1b) supplied to the output nodes are not driven to the rails (i.e., to voltage levels close to vpwr and vgnd). If voltage clamps were not included, the differential voltages (v1, v1b) could be latched to the next stage upon achieving full rail separation. Although undesirable in asynchronous operation, such latching may be appropriate when ISA/VSA 310 is configured for operating in a synchronous mode. Therefore, voltage clamping circuits (313, 314) may only be included (or enabled) when asynchronous operation is desired.

If included, voltage clamping circuits (313, 314) may be used for clamping the differential voltages (v1, v1b) once they reach predetermined voltage levels. For example, voltage clamping circuits (313, 314) may each include a diode-connected p-channel transistor (P10 or P11) and/or a diode-connected n-channel transistor (N10 or N11). Once sensing has occurred, the diode-connected p-channel and n-channel transistors (P10/N10 and P11/N11) may be coupled in series between a first voltage level (clampp), which is less than or equal to the power supply voltage (vpwr), and a second voltage level (clampn), which is greater than or equal to the ground supply voltage (vgnd). During non-sensing operations, clampp may be set to vgnd, while clampn is set to vpwr to insure that the clamping devices are cutoff. In some cases, the clamping voltages (clampp, clampn) may be generated by associated circuitry 315. When supplied to voltage clamping circuits (313, 314), one of the clamping voltages (clampp) may be used to prevent an output node voltage (v1 or v1b) from reaching the power supply voltage, while the other (clampn) is used to prevent the opposite output node voltage (v1 or v1b) from reaching the ground supply voltage (vgnd).

As shown in FIG. 3, the operation of the first and subsequent stages may be controlled by a plurality of sense amp enable signals (saen1, saen2, saen3). Following equalization of the bitlines, the first stage may be enabled in a two step process. For example, a first sense amp enable signal (saen1) may be supplied to the current reference branches (311, 312) for generating the differential reference currents (Iref, Irefb). In particular, the saen1 signal may be supplied to the gate terminals of enable transistors P1-P5 and N7-N8, as shown in FIG. 3. After a short amount of delay, a second sense amp enable signal (saen2) may be supplied for enabling the output stage of ISA/VSA 310. For example, the saen2 signal may be supplied to the gate terminals of enable transistors P6, P7 and N9. In some cases, the delayed version of saen1 (saen2) may be directly proportional to the amount of mismatch occurring between the matched transistor pairs (e.g., between N1/N2 and/or N3/N4).

After another short amount of delay, a third sense amp enable signal (saen3) may be supplied to the (optional) voltage clamp circuitry to prevent latching. The saen3 signal may also be used for supplying the second (320) and third (330) stages with the memory cell data sensed by ISA/VSA 310. Once equalization occurs, the bitlines are precharged to the correct logic levels (e.g., vpwr) and all stages of the sense amplifier are disabled so that no active current is realized.

The second (320) and third (330) stages of the improved sense amplifier design may be implemented with substantially any differential amplifier and buffer circuit design. For example, although particular circuit schematics are shown in FIG. 3, the improved sense amplifier design may utilize any differential amplifier capable of amplifying the first stage differential signals (v1, v1b) to produce second stage differential signals (v2, v2b). Likewise, substantially any buffer circuit design may be used for supplying the sense amplifier outputs (out, outb) with a predetermined voltage swing. For this reason, the particular circuit schematics are shown in FIG. 3 will not be described in further detail herein.

The sense amp circuit (300) shown in FIG. 3 provides many advantages over the earlier design (200) shown in FIG. 2. For example, the improved first stage design includes an ISA/VSA for converting differential bitline voltages into reference currents. One advantage of using an ISA/VSA over the VSA used in FIG. 2 is that the ISA/VSA circuit generates reference currents, which require very little differential input voltage to operate. In addition, the improved first stage design includes a pair of current reference branches for generating a pair of reference currents in response to the differential input signals supplied thereto. The current reference branches help to increase amplification and improve the performance of the sense amp circuit under extreme mismatch conditions. Furthermore, positive feedback is used within the improved first stage design to further increase the gain of the first stage, while increasing the speed of the sense operation. These improvements enable sense amp circuit 300 to obtain a much faster read access time (e.g., up to 50% faster) than the earlier design. They also greatly improve the robustness of sense amp circuit 300 by reducing circuit sensitivity to device mismatch.

In addition to the embodiments described above, the inventive concepts may be modified or adjusted to produce various alternative embodiments of the invention. For example, sense amplifier circuit 300 can be modified to work in synchronous devices by disabling the voltage clamps (313, 314). This enables the sense amplifier circuit to be used in virtually any type of memory device. In another example, the type of transistors and power supplies used may be modified, such that n-channel devices are swapped for p-channel devices and power supply voltages are swapped for ground supply voltages (and vice versa). Other embodiments and modifications are possible and within the scope of the invention.

Embodiments of the present invention are well suited to performing various other steps or variations of the steps recited herein, and in a sequence other than that depicted and/or described herein. For purposes of clarity, many of the details of the improved circuit and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment," "one embodiment," and/or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects may lie in less than all features of a single foregoing disclosed embodiment. Thus, the claims following the claims are hereby expressly incorporated into this detailed description, with each claim standing on its own as a separate embodiment of this invention.

What is claimed is:

1. A sense amplifier circuit having at least a sensing stage and an amplifying stage, the sensing stage comprising:
   a pair of input transistors coupled for generating a pair of differential reference currents in response to a pair of differential input signals supplied to the sense amplifier circuit;
   a pair of current mirrors coupled for amplifying and mirroring the pair of differential reference currents; and
   a pair of output nodes coupled for receiving a pair of differential voltages corresponding to the amplified, mirrored currents.

2. The sense amplifier circuit as recited in claim 1, wherein the pair of differential input signals comprise differential voltage signals.

3. The sense amplifier circuit as recited in claim 1, wherein the pair of current mirrors each include a first transistor, which is diode-connected and shares a common gate connection with a second transistor.

4. The sense amplifier circuit as recited in claim 3, wherein the pair of current mirrors are configured for amplifying the pair of differential reference currents by forming the first and second transistors, such that one is N times larger than the other.

5. The sense amplifier circuit as recited in claim 4, wherein N is an integer value greater than or equal to 2.

6. The sense amplifier circuit as recited in claim 4, wherein the pair of input transistors comprise n-channel devices with gate terminals connected to a pair of input nodes for receiving the pair of differential input signals, drain terminals connected to a power supply voltage, and source terminals connected to the diode-connected transistors of the current mirror.

7. The sense amplifier circuit as recited in claim 6, wherein the sensing stage further comprises a pair of cross-coupled transistors coupled for amplifying the pair of differential voltages supplied to the output nodes.

8. The sense amplifier circuit as recited in claim 7, wherein the pair of cross-coupled transistors comprise p-channel devices having mutually-connected source terminals connected to the power supply voltage and drain/gate terminals connected to the output nodes of the sensing stage.

9. The sense amplifier circuit as recited in claim 8, wherein the sensing stage further comprises a pair of voltage clamping circuits coupled for clamping the pair of differential voltages once they reach predetermined voltage levels, thereby preventing the differential voltages from reaching the power supply voltage or a ground supply voltage.

10. The sense amplifier circuit as recited in claim 9, wherein the pair of voltage clamping circuits each comprise a diode-connected p-channel transistor and a diode-connected n-channel transistor, which are coupled in series between a first predetermined voltage level greater than or equal to the ground supply voltage and a second predetermined voltage level less than or equal to the power supply voltage.

11. A memory device, comprising:
   a plurality of memory cells arranged in a plurality of rows and columns;
   a sense amplifier circuit, comprising:
      a sensing stage configured for: (a) generating a pair of differential reference currents in response to a pair of differential input signals received from at least one of the plurality of memory cells, (b) amplifying the pair of differential currents, and (c) mirroring the amplified currents to produce a pair of differential voltages;
      an amplifying stage configured for amplifying the pair of differential voltages; and
      a buffer stage configured for outputting the amplified pair of differential voltages with a predetermined voltage swing.

12. The memory device as recited in claim 11, wherein the sensing stage comprises a pair of input transistors coupled for receiving the pair of differential input signals and configured for generating the pair of differential reference currents in response thereto.

13. The memory device as recited in claim 12, wherein the sensing stage further comprises a pair of current mirrors coupled for amplifying the pair of differential reference currents and for mirroring the amplified currents to generate the pair of differential voltages upon a pair of output nodes associated with the sensing stage.

14. The memory device as recited in claim 13, wherein the sensing stage further comprises a pair of cross-coupled transistors coupled for amplifying the pair of differential voltages supplied to the output nodes before they are supplied to the amplifying stage.

15. The memory device as recited in claim 14, wherein the memory device comprises a synchronous memory device.

16. The memory device as recited in claim 14, wherein the sensing stage further comprises a pair of voltage clamping circuits coupled for clamping the pair of differential voltages once they reach predetermined voltage levels, thereby preventing the differential voltages from reaching a power supply voltage or a ground supply voltage.

17. The memory device as recited in claim 16, wherein the memory device comprises an asynchronous memory device.

18. A method for operating a sense amplifier circuit, the method comprising:
   utilizing a sensing stage of the sense amplifier circuit for:
      generating a pair of differential reference currents in response to a pair of differential input signals supplied to input nodes of the sensing stage;
      amplifying the pair of differential reference currents;
      mirroring the amplified currents to generate a pair of differential voltages upon output nodes of the sensing stage; and
      amplifying the pair of differential voltages before the amplified voltages are supplied to a subsequent amplifying stage of the sense amplifier circuit.

19. The method as recited in claim 18, wherein the steps of generating a pair of differential reference currents, amplifying the pair of differential reference currents and mirroring the amplified currents improve the accuracy and reliability of the sense amplifier circuit by reducing a sensitivity of the sense amplifier circuit to transistor mismatch.

20. The method as recited in claim 18, wherein the step of amplifying the pair of differential voltages increases a sensing speed of the sense amplifier circuit by providing the differential voltages with a relatively large gain, even when relatively small differential input signals are supplied to the input nodes.

* * * * *